United States Patent [19]

Silverglate et al.

[11] Patent Number: 5,013,144
[45] Date of Patent: May 7, 1991

[54] LIGHT SOURCE HAVING A MULTIPLY CONIC LENS

[75] Inventors: David E. Silverglate, Santa Cruz; Greg P. Smestad, San Jose, both of Calif.

[73] Assignee: Hewlett-Packard Company, Palo Alto, Calif.

[21] Appl. No.: 560,489

[22] Filed: Jul. 23, 1990

Related U.S. Application Data

[63] Continuation of Ser. No. 253,997, Oct. 15, 1988, abandoned.

[51] Int. Cl.⁵ .............................................. G02B 3/04
[52] U.S. Cl. ..................................... 350/435; 362/326; 362/800
[58] Field of Search ............... 350/432, 433, 434, 435; 362/307, 308, 309, 326, 333, 800

[56] References Cited

U.S. PATENT DOCUMENTS 3,586,813  6/1971  Cruickshank ..................... 350/433
3,711,722  1/1973  Kavanagh .......................... 350/434

OTHER PUBLICATIONS

"Eccentric Lenses for Producing Ring Images" by J. B. Goodell, *Applied Optics*, vol. 8, #12, Dec. 1969.

Primary Examiner—Bruce Y. Arnold
Assistant Examiner—J. P. Ryan

[57] ABSTRACT

A lens for a light emitting diode (LED) lamp is formed as two ellipses rather than as one. The ellipses are axially symmetric and are translated away from the optical axis with each ellipse having a focus located on the LED chip away from the central bond pad so that the bond pad shadow does not decrease on-axis light intensity. In alternative embodiments, the depression located at the intersection of the two ellipses is flattened and the axes of the two ellipses are translated away from the optical axis and are also tilted.

26 Claims, 6 Drawing Sheets

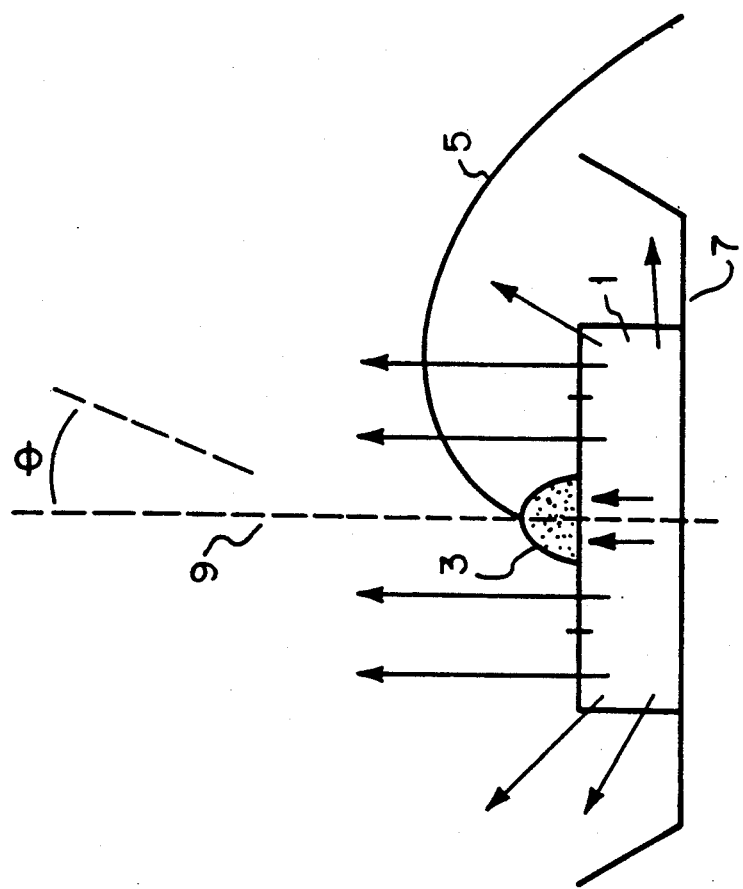

LIGHT SOURCE HAVING A MULTIPLY CONIC LENS

This application is a continuation of application Ser. No. 253,997, filed Oct. 15, 1988, now abandoned.

BACKGROUND AND SUMMARY OF THE INVENTION

Light emitting diodes (LEDs) have typically been used in low power devices such as displays and annunciators. More recently, higher power LED chips have made possible LED illumination lamps which have begun to replace incandescent bulbs in applications such as automobile stop lights. In many low and high power applications the on-axis intensity of the LED must be maximized in order to maximize the perceived brightness of the LED.

Commonly available LED lamps, such as the Hewlett-Packard Company model HLMP-D101 lamp shown schematically in FIG. 1, use an axially centered radius dome lens to image the top surface of the LED chip onto a viewing plane. Since electrical power is provided through a wire bonded to the top surface of the chip, the lens also images the shadow cast by the bond pad. Unfortunately, this shadow falls directly on the longitudinal axis of the LED lamp and the on-axis light intensity is minimized as shown in FIG. 2A. A viewer looking at the LED lamp along the longitudinal axis would see a central dark spot surrounded by a ring of light as shown in FIG. 2B.

In accordance with an illustrated preferred embodiment of the present invention, a multiply conic lens is used to maximize the on-axis light intensity of the LED lamp by overcoming the effect of the bond pad shadow. In cross-section, the lens appears as two rotationally symmetric conic sections rather than as the single ellipse used in the prior art. For optimal illumination, ellipses may be used as the conic sections. In this case, the axes of the two ellipses are parallel to the longitudinal (or optical) axis and each ellipse has a focus located on the top surface of the LED chip. Unlike the centered single ellipse used in prior art lenses, the axes of the two ellipses are each translated away from the optical axis which intersects bond pad centered on the chip. The two ellipses of the lens create overlapping images of the chip top surface which combine to maximize the on-axis light intensity of the LED lamp.

In another illustrated preferred embodiment of the present invention, the center depression in the lens formed by the intersection of the two ellipses is flattened. This flattening greatly improves manufacturability of the lens and has only a small effect on the on-axis light intensity of the LED lamp.

In yet another illustrated preferred embodiment of the present invention, the axes of the two ellipses (which are each translated away from the optical axis) are tilted either inward or outward in order to modify or tailor the light intensity profile of the LED lamp.

BRIEF DESCRIPTION OF THE DRAWINGS

FIG. 3 is a schematic cross section of an LED chip and reflector cup used in the preferred embodiments of the present invention.

DETAILED DESCRIPTION OF THE PREFERRED EMBODIMENTS

Figure 1A:
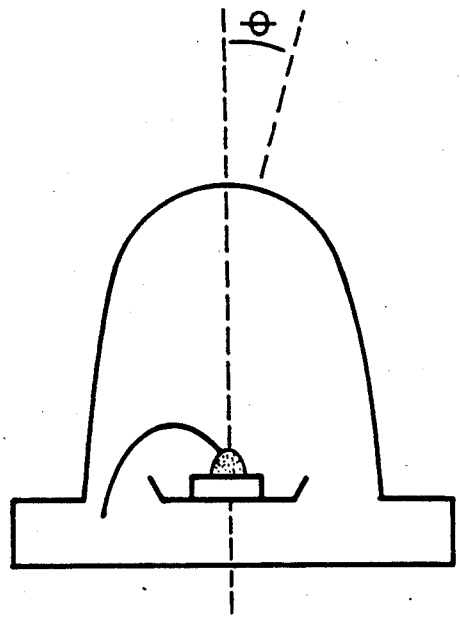
FIG. 1 shows a prior art LED lamp that uses a centered radius dome lens.
Figure 2A:
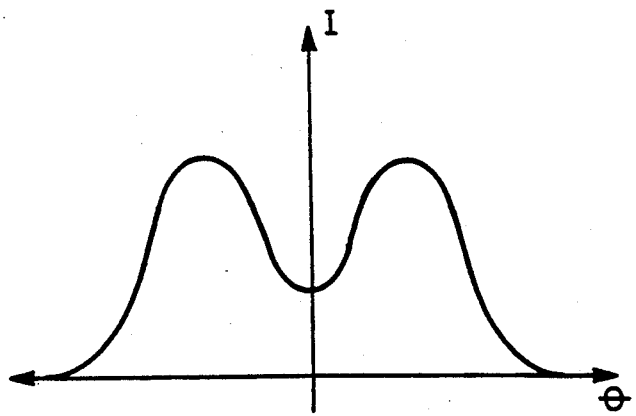
FIG. 2A is a profile of the light intensity of the prior art lamp shown in FIG. 1 as a function of viewing angle from the optical axis.
Figure 2B:
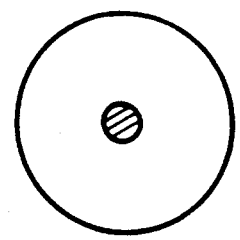
FIG. 2B shows an on-axis view of the light output of the lamp shown in FIG. 1.

FIG. 1 shows a commonly available LED lamp, such as the Hewlett-Packard Co. model HLMP-D101 which uses a centered radius dome lens having a focus located on the optical axis of the lamp. The bond pad used to attach the power lead to the top surface of the LED chip is also centered on the chip surface and lies on the optical axis. Thus, as shown in FIG. 2A, the on-axis (theta=0°) light intensity is at a minimum because of the shadow of the bond pad. A viewer looking directly along the optical axis of the lamp shown in FIG. 1 would see a disk of light surrounding a central dark spot in a "bulls-eye" pattern.

FIG. 3 is a schematic cross section of an LED chip 1 that may be used in a lamp constructed according to a preferred embodiment of the present invention. The chip 1 may be fabricated from GaAs, GaAsP, AlGaAs or other compounds and may use either an absorbing or a non-absorbing substrate. The chip 1 is mounted within a reflector cup 7 which directs light generated by the chip within a desired angle of divergence from the optical axis 9. The cup 7 may be formed in any of a number of conventional ways such as by coining the LED lead frame. The cup 7 may also be formed in the manner described in the copending U.S. patent application to the same assignee entitled "Nonimaging Light Source" which is incorporated herein by reference. For the sake of clarity, the details of the lead frame and electrical connection (which may all be constructed in well known manners) are not shown in the figures. A bond pad 3, which is typically formed of gold or another optically opaque metal, attaches a power lead 5 to the upper surface of the chip 1 and absorbs a portion of the light emitted by the chip 1.

Figure 4:
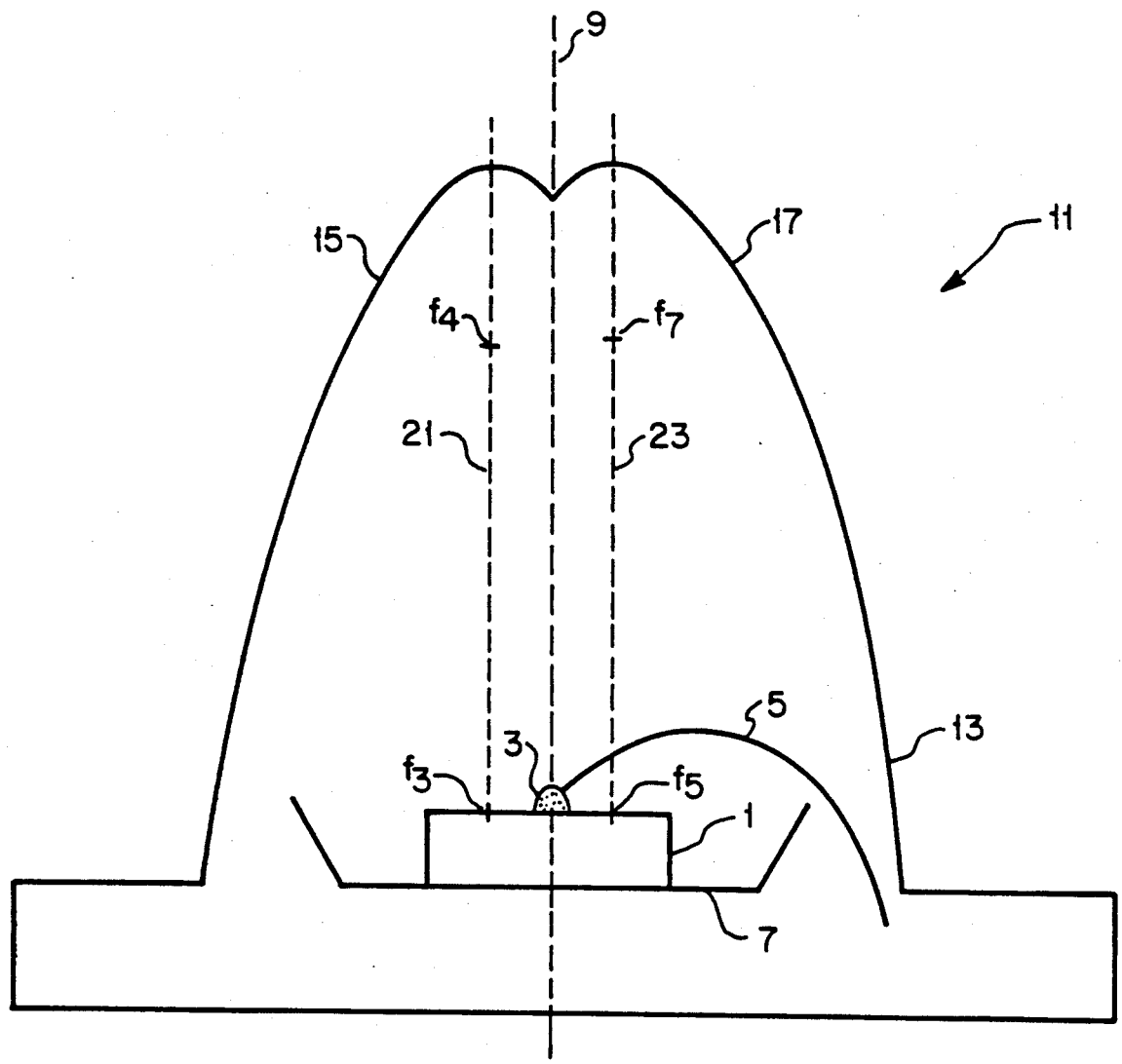
FIG. 4 is a schematic cross section of an LED lamp having a multiply conic lens in accordance with a preferred embodiment of the present invention.

FIG. 4 is a schematic cross section of an LED lamp 11 that is fabricated in accordance with a preferred embodiment of the present invention using the structure shown in FIG. 3. Instead of appearing in cross-section as only a single ellipse, lens 13 appears in cross-section as two separate conic sections. For optimal illumination, these two conic sections may be ellipses 15, 17 although other conic sections such as parabolas might be used. The lens 13 and the ellipses 15, 17 are rotationally symmetric about the optical axis 9 in order to provide a symmetric illumination pattern. The axes of symmetry 21, 23 of the two ellipses 15, 17 are both parallel to the optical axis 9 and are translated away from the optical axis 9 to lie approximately half way between the edge of bond pad 3 and the edge of chip 1. Each of the ellipses 15, 17 has a focus (f₃, f₅) located on the upper surface of chip 1.

Figure 5A:
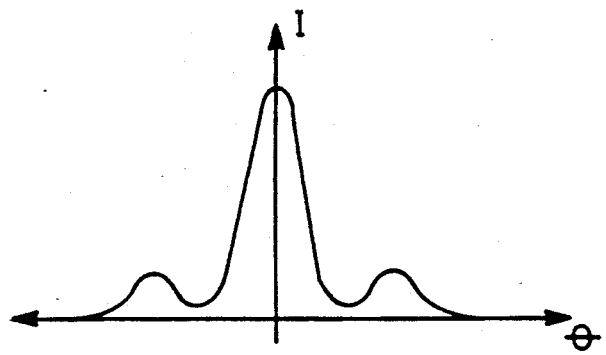
FIG. 5A is a profile of the light intensity of the lamp shown in FIG. 4 as a function of viewing angle from the optical axis.
Figure 5B:
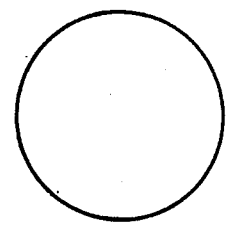
FIG. 5B shows an on-axis view of the light output of the lamp shown in FIG. 4.

FIG. 5A is a profile of the light intensity of the lamp 11 as a function of the viewing angle (theta) from the optical axis 9. Each of the ellipses 15, 17 forms an image of the chip 1 that is centered between the bond pad 3 edge and the chip 1 edge rather than directly on the shadow of the bond pad 3. The superposition of the two images maximizes on-axis light intensity, as shown in FIG. 5A, by displacing each shadow image from the optical axis 9 and by combining each with light from the other image. To a viewer looking down the optical axis 9, the illumination would appear as a uniform filled-in circle of light.

The lamp 11 shown in FIG. 4 may easily be fabricated using techniques known in the optical electronics industry. The chip 1, bond pad 3, wire 5, reflector cup 7 and other components may comprise well known elements used in commonly available LED lamps such as the Hewlett-Packard Co. model HLMP-D101. The lens 13 may be fabricated from any of a number of well known materials such as the "PT" epoxy which is commercially available from Essex Polytech Company and has an index of refraction of n=1.53.

A lamp 11 was constructed as shown in FIG. 4 using a 10 mil square by 10 mil high AlGaAs red LED chip having a 4 mil diameter gold bond pad. The axes 21, 23 were located 7 mils apart so that the foci $f_3$, $f_5$ would lie halfway between the bond pad and the chip 1 edge. The eccentricity of each ellipse 15, 17 was e=1/n=0.65. The lens 13 was fabricated as an immersion lens so that the epoxy material completely encapsulated the interior of the lamp 11. The diameter at the base of the lens 13 was approximately 0.2 inch and the total height of the lens 13 was approximately 0.3 inch.

Figure 6:
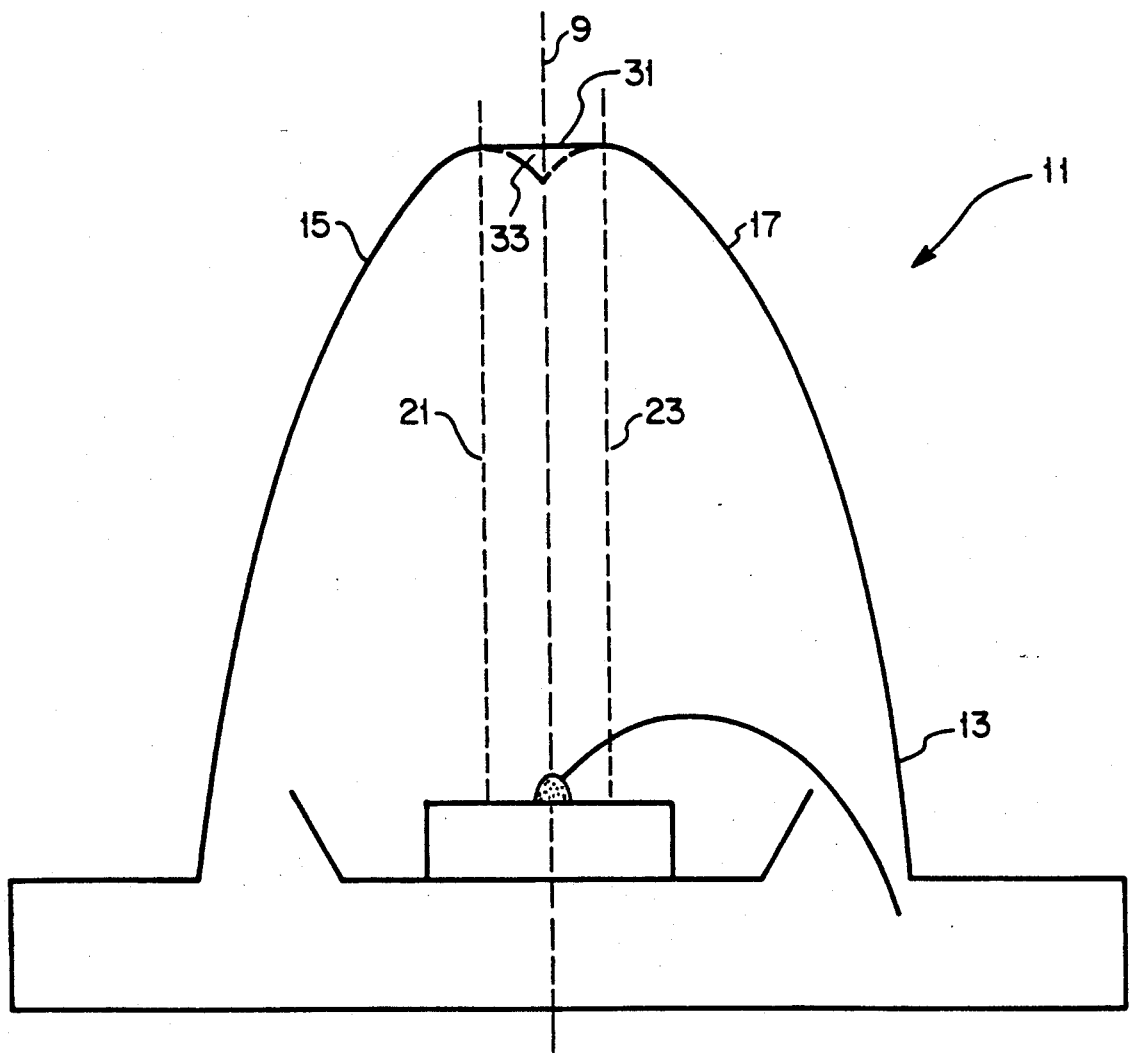
FIG. 6 is a schematic cross section of another preferred embodiment of the present invention in which the multiply conic lens shown in FIG. 4 is flattened.

FIG. 6 is a schematic cross section of an alternative embodiment of the present invention in which the lens 13 shown in FIG. 4 is modified slightly to enhance its manufacturability. Because the axes 21, 23 of the two ellipses 15, 17 are translated from each other, a slight depression or dimple 33 exists at the top of the lens 13 at the intersection of the two ellipses 15, 17. The dimple 33 was 7 mils wide and approximately 3 mils deep for the lens 11 constructed as discussed above using the 10 mil LED chip 1. Epoxy molding of such a small feature would be difficult and could increase the manufacturing cost of the lamp 11. In this alternative embodiment, the dimple 33 was filled in so that the top 31 of the lens 11 was flat. This modification greatly improved manufacturing ease of the lamp 11 and decreased the on-axis light intensity by a calculated 5%.

Figure 7A:
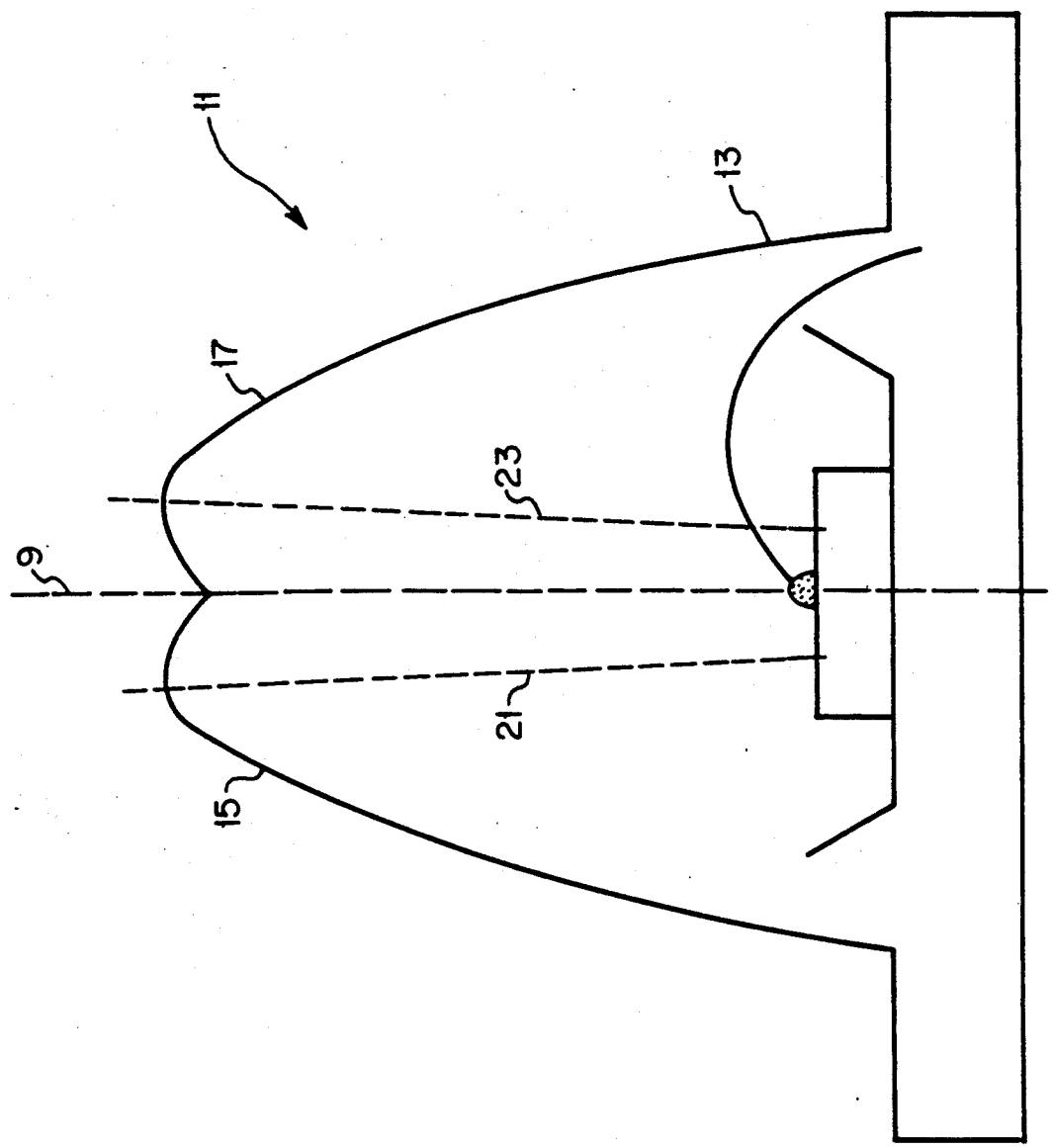
FIGS. 7A–B are schematic cross sections of other preferred embodiments of the present invention in which the axes of the ellipses are tilted.
Figure 7B:
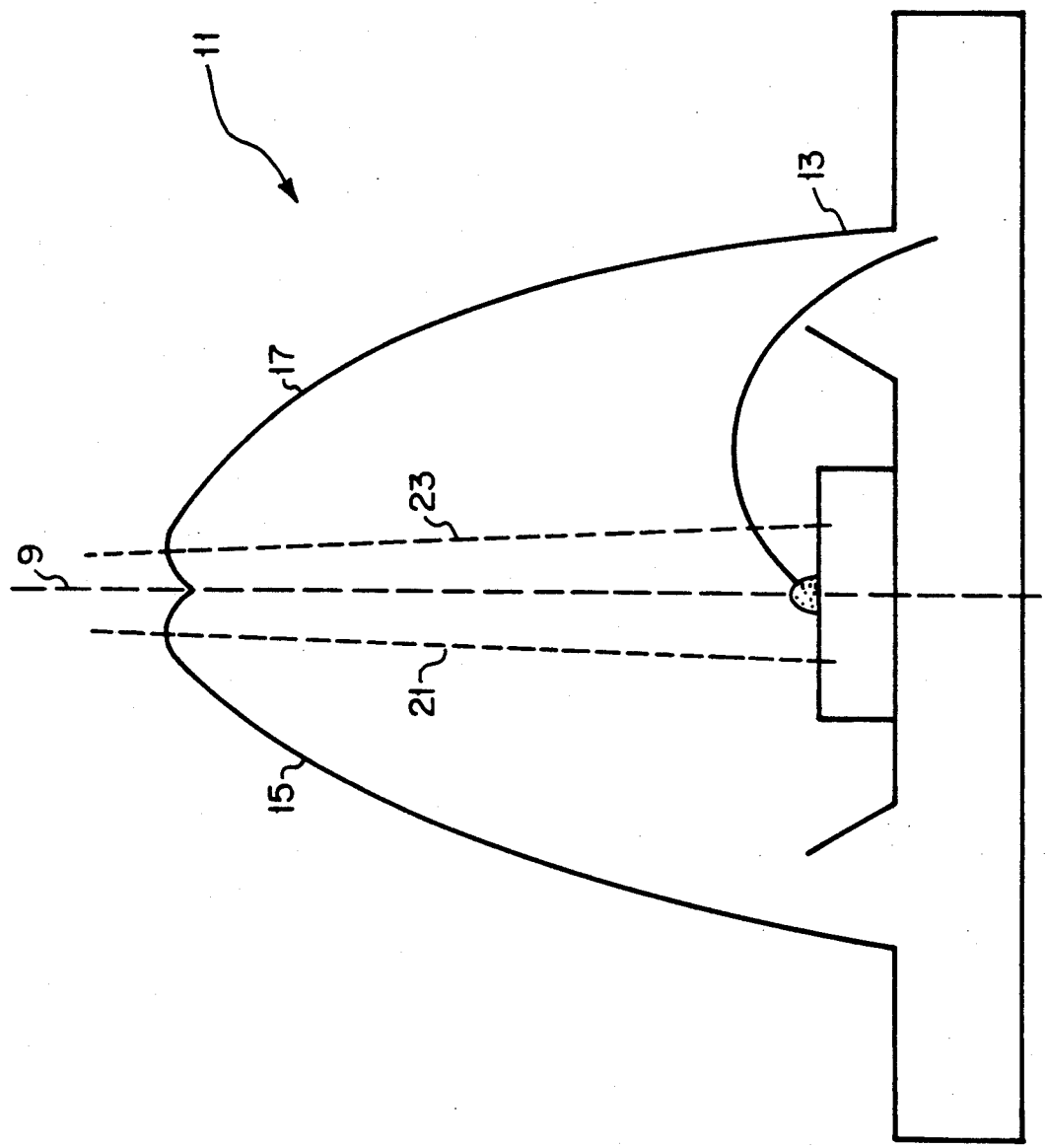

FIGS. 7A and 7B show additional alternative embodiments of the present invention by which the light intensity profile of the lamp 11 may be varied. The lens 11 may be modified by tilting the axes 21, 23 (which are each translated away from the optical axis 9) of the two ellipses 15, 17 either inward or outward while maintaining rotational symmetry. Tilting outward, as shown in FIG. 7A, would tend to decrease on-axis intensity and lower and broaden the on-axis intensity peak shown in FIG. 5A. Tilting inward, as shown in FIG. 7B, would tend to narrow the peak. The observed light uniformity may also be modified by tilting the axes 21, 23.

We claim:

1. A lens that is rotationally symmetric about an optical axis, the lens comprising in cross-section:
   a first conic section having a first axis parallel to and displaced from the lens optical axis; and
   a second conic section having a second axis parallel to and displaced from the lens optical axis opposite the first conic section, such that the first and second conic sections intersect at the lens optical axis.

2. A lens as in claim 1, wherein the first and second conic sections are ellipses.

3. A lens as in claim 2, further comprising a filler section located at the intersection of the first and second conic sections such that the lens has a substantially flat top surface.

4. A lens as in claim 3, wherein the first and second conic sections and the filler section are fabricated from an optically transmissive material which encapsulates substantially all of the lens interior volume.

5. A lens as in claim 1, further comprising a filler section located at the intersection of the first and second conic sections such that the lens has a substantially flat top surface.

6. A lamp for emitting light along its optical axis, the lamp comprising:
   a source for emitting the light;
   a cup, connected to and containing the source, for supporting the source and for directing the light along the lamp optical axis; and
   a lens, rotationally symmetric about a lens optical axis alignable with the lamp optical axis, comprising in cross-section a first conic section having a first axis parallel to and displaced from the lens optical axis and a second conic section having a second axis parallel to and displaced from the lens optical axis opposite the first conic section, the first and second conic sections intersecting at the lens optical axis;
   wherein the first and second conic sections each has a surface focus located on an upper surface of the source.

7. A lamp as in claim 6, wherein the first and second conic sections are ellipses.

8. A lamp as in claim 7, wherein the lens further comprises a filler section located at the intersection of the first and second conic sections such that the lens has a substantially flat top surface.

9. A lamp as in claim 8, wherein:
   the source comprises an LED;
   an optically opaque bond pad is located on the upper surface of the LED; and
   the surface foci of the first and second conic sections are positioned on the LED upper surface between the bond pad and the LED edge.

10. A lamp as in claim 9, wherein the surface foci are positioned on the LED upper surface substantially half the distance between the bond pad and the LED edge.

11. A lamp as in claim 8, wherein the first and second conic sections and the filler section are fabricated from an optically transmissive material which encapsulates substantially all of the lens interior volume.

12. A lamp as in claim 7, wherein:
   the source comprises an LED;
   an optically opaque bond pad is located on the upper surface of the LED; and
   the surface foci of the first and second conic sections are positioned on the LED upper surface between the bond pad and the LED edge.

13. A lamp as in claim 12, wherein the surface foci are positioned on the LED upper surface substantially half the distance between the bond pad and the LED edge.

14. A lamp as in claim 7, wherein the first and second conic sections and the filler section are fabricated from an optically transmissive material which encapsulates substantially all of the lens interior volume.

15. A lamp as in claim 6, wherein the lens further comprises a filler section located at the intersection of the first and second conic sections such that the lens has a substantially flat top surface.

16. A lamp as in claim 15, wherein:
the source comprises an LED;
an optically opaque bond pad is located on the upper surface of the LED; and
the surface foci of the first and second conic sections are positioned on the LED upper surface between the bond pad and the LED edge.

17. A lamp as in claim 15, wherein the first and second conic sections and the filler section are fabricated from an optically transmissive material which encapsulates substantially all of the lens interior volume.

18. A lamp as in claim 6, wherein:
the source comprises an LED;
an optically opaque bond pad is located on the upper surface of the LED; and
the surface foci of the first and second conic sections are positioned on the LED upper surface between the bond pad and the LED edge.

19. A lamp as in claim 6, wherein the first and second conic sections and the filler section are fabricated from an optically transmissive material which encapsulates substantially all of the lens interior volume.

20. A lens that is rotationally symmetric about an optical axis, the lens comprising in cross-section:
a first conic section having a first axis translated and tilted from the lens optical axis; and
a second conic section having a second axis translated and tilted from the lens optical axis opposite the first conic section, such that the first and second conic sections intersect at a point on the lens optical axis that is displaced from all foci of both conic sections.

21. A lens as in claim 20, wherein the first and second conic sections are ellipses.

22. A lens as in claim 20, further comprising a filler section located at the intersection of the first and second conic sections such that the lens has a substantially flat top surface.

23. A lamp for emitting light along its optical axis, the lamp comprising:
a source for emitting the light;
a cup, connected to and containing the source, for supporting the source and for directing the light along the lamp optical axis; and
a lens, rotationally symmetric about a lens optical axis alignable with the lamp optical axis, comprising in cross-section a first conic section having a first axis translated and tilted from the lens optical axis and a second conic section having a second axis translated and tilted from the lens optical axis opposite the first conic section, the first and second conic sections intersecting at the lens optical axis;
wherein the first and second conic sections each has a surface focus located on an upper surface of the source.

24. A lamp as in claim 23, wherein the first and second conic sections are ellipses.

25. A lamp as in claim 24, wherein:
the source comprises an LED;
an optically opaque bond pad is located on the upper surface of the LED; and
the surface foci of the first and second conic sections are positioned on the LED upper surface between the bond pad and the LED edge.

26. A lamp as in claim 23, wherein:
the source comprises an LED;
an optically opaque bond pad is located on the upper surface of the LED; and
the surface foci of the first and second conic sections are positioned on the LED upper surface between the bond pad and the LED edge.

* * * * *